(12) United States Patent
Hall

(10) Patent No.: US 6,175,239 B1
(45) Date of Patent: Jan. 16, 2001

(54) PROCESS AND APPARATUS FOR DETERMINING TRANSMISSION LINE CHARACTERISTIC IMPEDANCE

(75) Inventor: Stephen Hall, Hillsboro, OR (US)

(73) Assignee: Intel Corporation, Santa Clara, CA (US)

( * ) Notice: Under 35 U.S.C. 154(b), the term of this patent shall be extended for 0 days.

(21) Appl. No.: 09/221,578

(22) Filed: Dec. 29, 1998

(51) Int. Cl.$^7$ ............................. G01R 27/08; G01R 27/32

(52) U.S. Cl. ........................................... 324/713; 324/647

(58) Field of Search .................................. 324/713, 650, 324/647, 645, 646; 330/124, 144; 714/734, 737; 702/64, 65; 343/745, 850

(56) References Cited

U.S. PATENT DOCUMENTS

| | | | |
|---|---|---|---|
| 4,853,950 | * 8/1989 | Crane | 379/24 |
| 5,164,663 | * 11/1992 | Alcorn | 714/734 |
| 5,386,194 | * 1/1995 | Moehlmann | 324/650 |
| 5,559,441 | * 9/1996 | Desroches | 324/647 |
| 5,633,801 | * 5/1997 | Bottman | 702/65 |
| 5,880,635 | * 3/1999 | Satoh | 330/144 |

OTHER PUBLICATIONS

Moshe Sipper and Edmund M. A. Ronald, "A new species of hardware" (IEEE Spectrum Mar. 2000 pp. 59–64).*

* cited by examiner

Primary Examiner—Safet Metjahic
Assistant Examiner—Anjan K Deb
(74) Attorney, Agent, or Firm—Antonelli, Terry, Stout & Kraus, LLP

(57) ABSTRACT

A process and apparatus are provided to determine the characteristic impedance of a transmission line coupled to the output of a buffer. To achieve this, an output resistance of the buffer is initially set to a relatively high value to underdrive the transmission line. The output resistance of the buffer is then decreased until the buffer overdrives the transmission line. The characteristic impedance of the transmission line can then be determined from a ringback voltage which occurs due to the overdriving of the transmission line. In accordance with an embodiment of the invention, the ringback voltage can be detected by noting when a reference voltage is crossed twice during the same time of the driving pulse on the transmission line (the second crossing being the ringback voltage). The characteristic impedance of the transmission line can then be used to set the output resistance for the buffers on the operational buses. In a system application, the buffer and the transmission line can be provided as a test buffer and a dummy trace formed on a printed circuit board in order to establish suitable values for the output resistance of operational buffers and buses formed on the same printed circuit board.

23 Claims, 3 Drawing Sheets

PROCESS AND APPARATUS FOR DETERMINING TRANSMISSION LINE CHARACTERISTIC IMPEDANCE

FIELD OF THE INVENTION

The present invention relates to electronic equipment such as processors, and, more particularly, to determining characteristic impedance of transmission lines used with such processors.

BACKGROUND OF THE INVENTION

Present day electronic equipment, including processors and related devices, frequently requires transmission lines such as buses to provide high speed connections for passing signals between circuit elements. To this end, printed circuit boards (PCBS) and multiple chip modules (MCMs) can be manufactured with buses formed on one or more layers thereof to provide the desired high speed connections. Generally, a circuit element transmits a signal over the transmission line utilizing an output buffer to provide drive signals from the circuit element to the transmission line. Ideally, the output impedance of such output buffers is matched with a characteristic impedance of the transmission line. However, in reality, the output impedance of such output buffers is frequently mismatched with the characteristic impedance of the transmission line. The end result can be a significant decrease in signal integrity due to the mismatch, and a subsequent decrease in system performance.

As an example, in present processor systems using PCBs and MCMs, board manufacturers generally guarantee the boards to provide one or more buses typically having a variance of ±15% from a target value (e.g., 50–65 Ω). This means that the characteristic impedance of the buses can vary by 30% or more from lot to lot. In the past, buffers used with such buses have an output resistance referenced to an external resistor to try to set a target resistance. Inevitably, some products will be delivered with a significant impedance discontinuity between the buffers and the buses formed on the boards since, as noted above, the actual characteristic impedance of the board can vary by at least ±15% from the target value. This leads to a significant degradation of the signal integrity of the digital pulse signals provided to the buses by the buffers.

The problem of signal degradation caused by a mismatch between buffers and buses becomes worse as the speed of the buses is increased. One reason for this is that, as the speed of the buses increases, electrical delay on the buses becomes long compared with the edge rate of the digital pulses, resulting in significant reflections on the bus. A recent example of a high speed bus is the back side bus of the Pentium II (a registered trademark of Intel Corporation) processor, which presently runs faster than 200 MHz. At such high bus speeds, it is necessary for the impedance match between the output impedances of the buffers and the characteristic impedance of the buses to be as close as possible.

One solution to this problem is simply to provide better quality control of the characteristic impedance of the bus or buses formed on substrates such as PCBs or MCMs to reduce the variation from lot to lot. Unfortunately, this approach significantly increases the overall cost of the boards, which, of course, increases the overall product cost. Therefore, a significant need exists for an approach to minimize the amount of mismatch between buffers and buses without having to significantly increase the cost of manufacturing the boards.

SUMMARY OF THE INVENTION

An embodiment of the present invention provides a process and apparatus which can determine characteristic impedance of a transmission line coupled to the output of a buffer. To this end, an output impedance of the buffer is set to a value at which the buffer will underdrive the transmission line. The output resistance is then decreased until the buffer overdrives the transmission line. The characteristic impedance of the transmission line can then be determined from a ringback voltage at the end of the transmission line opposite the buffer which occurs due to overdriving the transmission line.

DETAILED DESCRIPTION

Figure 1:
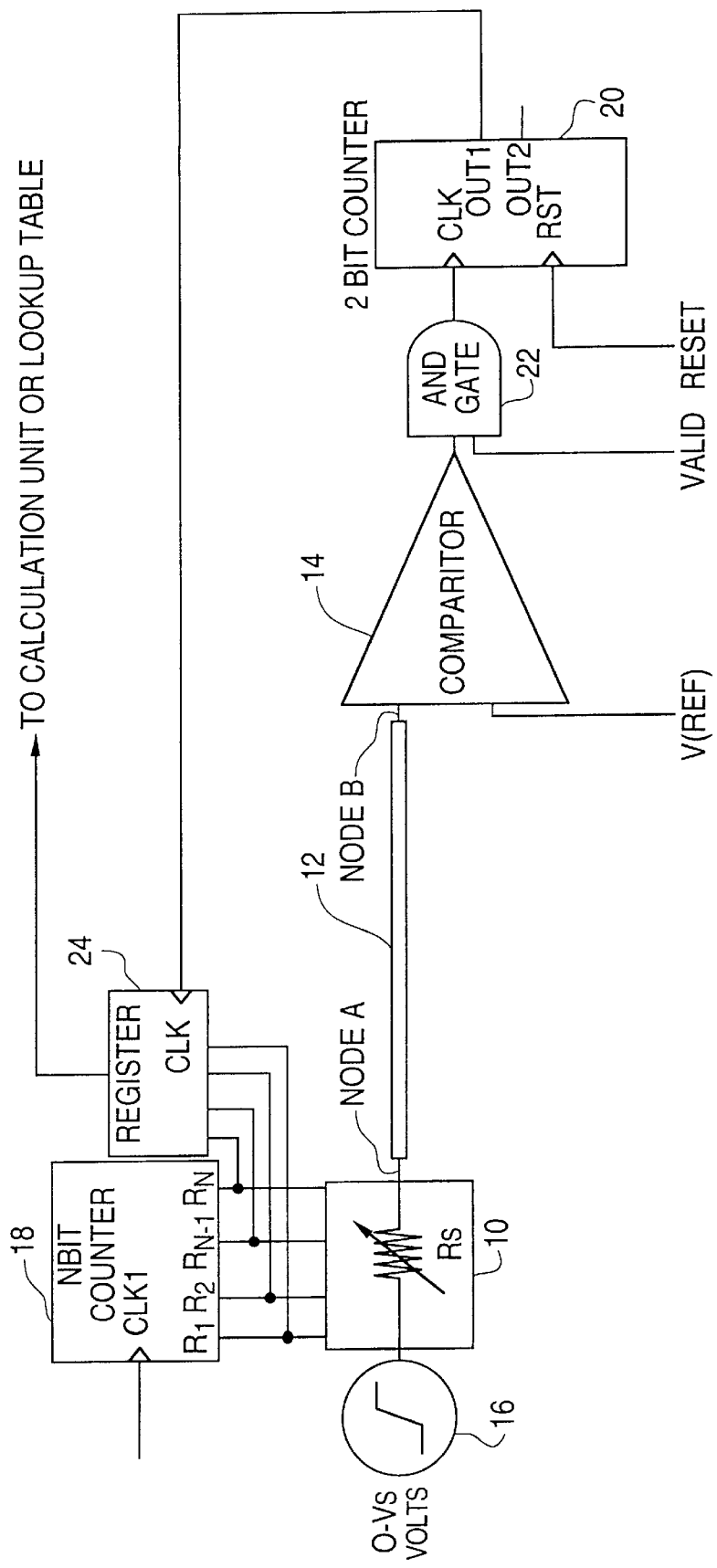
FIG. 1 shows an exemplary output buffer circuit coupled to a bus for determining the characteristic impedance of the bus in accordance with the present invention.

FIG. 1 shows an exemplary embodiment of a circuit which can be used in accordance with the present invention to determine the characteristic impedance of a transmission line 12 coupled to the output of a buffer 10. More specifically, the output of FIG. 1 can be used to match the output impedance of the buffers on the bus to the characteristic impedance of the transmission lines on the PCB after the characteristic impedance has first been determined. In accordance with a further aspect of the present invention, the transmission line 12 can be a trace dummy bus line formed on a PCB, although the invention is not limited to this. By establishing the characteristic impedance of such a dummy bus line using an arrangement such as shown in FIG. 1, Rs of all of the buffers used with the operational bus or buses of the PCB can be set. In other words, Zo of all of the buses for the PCB is effectively represented by Zo of the dummy bus line 12 since they are generally formed under the same conditions. Further, if buses are provided at different layers of a PCB, then an arrangement such as shown in FIG. 1 can be provided at each of the layers (i.e., trace dummy buses can be provided at each level) to determine the characteristic impedance Zo of the buses at different levels. This determination of Zo of the buses at the different levels can then be used to set the output resistance Rs of the output buffers coupled to the buses on different levels. It is to be noted, however, that the present invention is not limited to matching Rs of the output buffers to the Zo of the buses in PCBs and MCMs used in processors, but, on the contrary, can be used in any situation where it is necessary to quickly and accurately determine the characteristic impedance of a transmission line coupled to the output of a drive element.

As will be discussed in detail below, the circuit of FIG. 1 basically operates by setting Rs of the buffer to a high value to initially underdrive the transmission line 12. The output of the buffer 10 is coupled to a node A of the transmission line. The voltage $V_B$ at node B of the transmission line 12 is then compared with a reference V(ref) in a comparator 14 which initially will indicate the underdriven state of the transmission line 12. The comparator 14 preferably has a high input impedance and a low input capacitance to come as close as possible to appearing as an open circuit to the transmission line 12. Forming the comparator to have a high impedance CMOS input is one way to achieve this since such CMOS inputs typically have a high impedance and a low input capacitance (e.g., 2–5 picofarads).

After initially underdriving the transmission line, Rs is then incrementally decreased by the N bit counter 18 to increase the voltage provided to the line 12 by the buffer 10 until an overdrive situation is detected by the comparator 14. A ringback voltage Vb is then used to determine Zo of the transmission line 12, as will be discussed below with reference to FIG. 2. Once Zo is determined, this information can be used to set Rs for all buffers in the bus accordingly. And, as noted above, if the transmission line 12 is a dummy bus line on a PCB, the characteristic impedance of the dummy bus line can be used to set Rs of all the buffers connected to one or more operational buses of the PCB since the characteristic impedance of the dummy bus is effectively representative of all operational buses formed on the same layer of the PCB.

Figure 2:
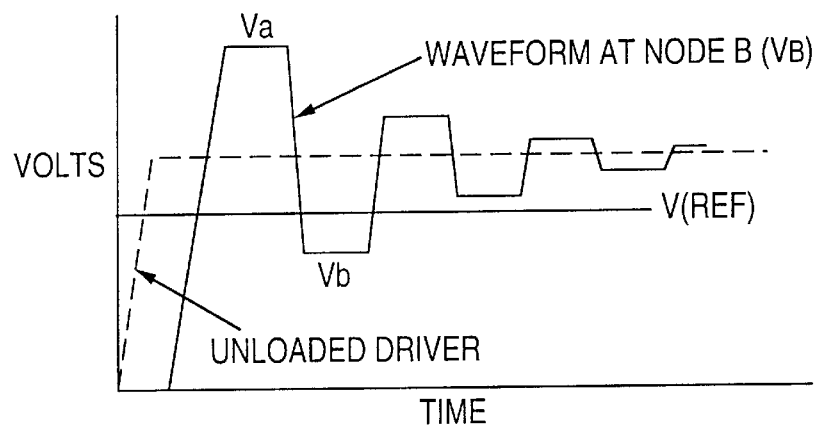
FIG. 2 shows an exemplary waveform of a response of an overdriven transmission line which can be used to determine characteristic impedance of the transmission line in accordance with the present invention.

FIG. 2 is an exemplary waveform showing the response of an overdriven transmission line 12. The ringback voltage Vb shown in FIG. 2 is used in the present invention to determine the characteristic impedance of the transmission line 12. In other words, FIG. 2 shows the overdrive situation which the circuit of FIG. 1 is set up to recognize so that an automatic determination of the characteristic impedance Zo of the transmission line 12 can be established.

Referring to FIG. 2, the solid line represents the voltage waveform $V_B$ at the node B of FIG. 1 when Rs of the buffer 10 is sufficiently reduced so that the transmission line 12 becomes overdriven. In this situation, the Rs is lower than the characteristic impedance Zo of the transmission line 12. The dashed line shows the state of an unloaded driver where the voltage from the driver directly goes to the value Vs set by the power supply 16 (noting that the rise time shown by the dashed line would occur in the situation where the characteristic impedance Zo of the transmission line exactly equals the output resistance Rs of the buffer). The dotted line represents a reference voltage V(ref) applied to the reference input of the comparator 14.

As can be seen in FIG. 2, when a transmission line 12 is overdriven, a "ringing" effect occurs where Vb repeatedly goes above and below the steady state voltage Vs until a steady state condition at Vs is reached. Each high and low point of the ringing represents a reflection along the line. Thus, Va is a first reflection, and Vb is a second reflection (hereinafter referred to as the ringback voltage). The values of Va and Vb are calculated as follows:

$$Va = Vs \frac{2Zo}{Rs + Zo} \quad (1)$$

$$Vb = Vs \frac{2Zo}{Rs + Zo} \left(1 + \frac{Rs - Zo}{Rs + Zo}\right) \quad (2)$$

Thus, if the ringback voltage Vb can be determined, and Rs is known, then Zo can be determined from equation 2.

In accordance with the present invention, the ringback voltage Vb can be determined by first underdriving the transmission line 12 and then gradually increasing the voltage drive (by reducing Rs) to determine when the ringback voltage Vb first crosses V(ref). When this occurs, Vb will substantially equal V(ref) (assuming that the incremental changes of Rs are relatively small), and Zo can be determined from equation 2.

Figure 4:
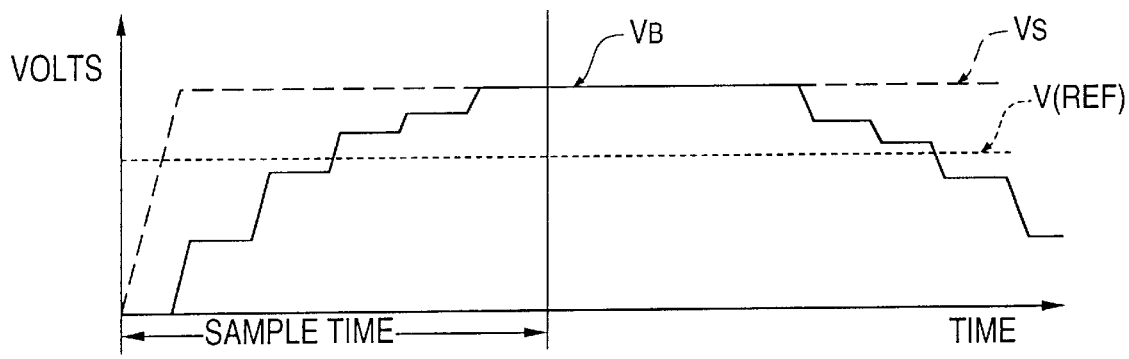
FIG. 4 shows an exemplary waveform of an initial underdriving of a transmission line in accordance with the present invention.

More specifically, when the transmission line 12 is underdriven, a situation occurs such as shown in the exemplary waveform diagram of FIG. 4. This situation is referred to as a stair-step operation wherein the voltage on the transmission line 12 stair-steps up to a steady state value Vs. In this underdriven situation, $V_B$ applied to the comparator 14 will only cross V(ref) one time during the rise time of the voltage on the transmission line 12. As will be discussed later, the sample period for the circuit of FIG. 1 is set to be shorter than the period of the total drive pulse from the buffer 10 so that only the rise time crossing of $V_B$ of V(ref) will be recognized in the underdriven situation. In other words, by making the sample time sufficiently short, the fall time crossing will not be considered. Thus, the circuit of FIG. 1 can recognize that an underdriven situation exists by the fact that only one crossing of V(ref) will occur for each sample period when a drive pulse is applied to the transmission line.

As noted above, the present invention operates by initially underdriving the transmission line 12 (by setting a high Rs) and then incrementally decreasing Rs until an overdrive situation occurs. As can be seen in comparing FIGS. 2 and 4, the overdrive situation can be recognized by the fact that the ringback voltage Vb will cross the reference voltage V(ref) a second time during the sample period (in other words, during the rise time or ringing which occurs on the transmission line from the overdrive situation). By making the increment of change of Rs small and the sensitivity of the comparator 14 high, the ringback voltage Vb can be very close to the value V(ref) so that an accurate determination of Zo can be provided by assuming that Vb substantially equals V(ref). In other words, once an overdrive situation is reached, the ringback voltage Vb should change in small amounts so that when it does cross V(ref), Vb will substantially equal V(ref). Otherwise, if the difference between Vb and V(ref) is large due to large incremental changes of Rs, the assumption that Vb equals V(ref) will be false, and the resulting determination of Zo will be inaccurate.

Ideally, V(ref) should be close to Vs so that the overdrive situation can be quickly recognized and calculations made for Zo accordingly. However, V(ref) can be set at any value below Vs, if desired, with the understanding that if it is set significantly lower than Vs, it may take some time for the overdrive ringback voltage Vb to become sufficiently large to cross V(ref). In any event, if Rs is incremented in fine steps when Vb does cross V(ref), it will be accurate to assume that Vb substantially equals V(ref).

Figure 3:
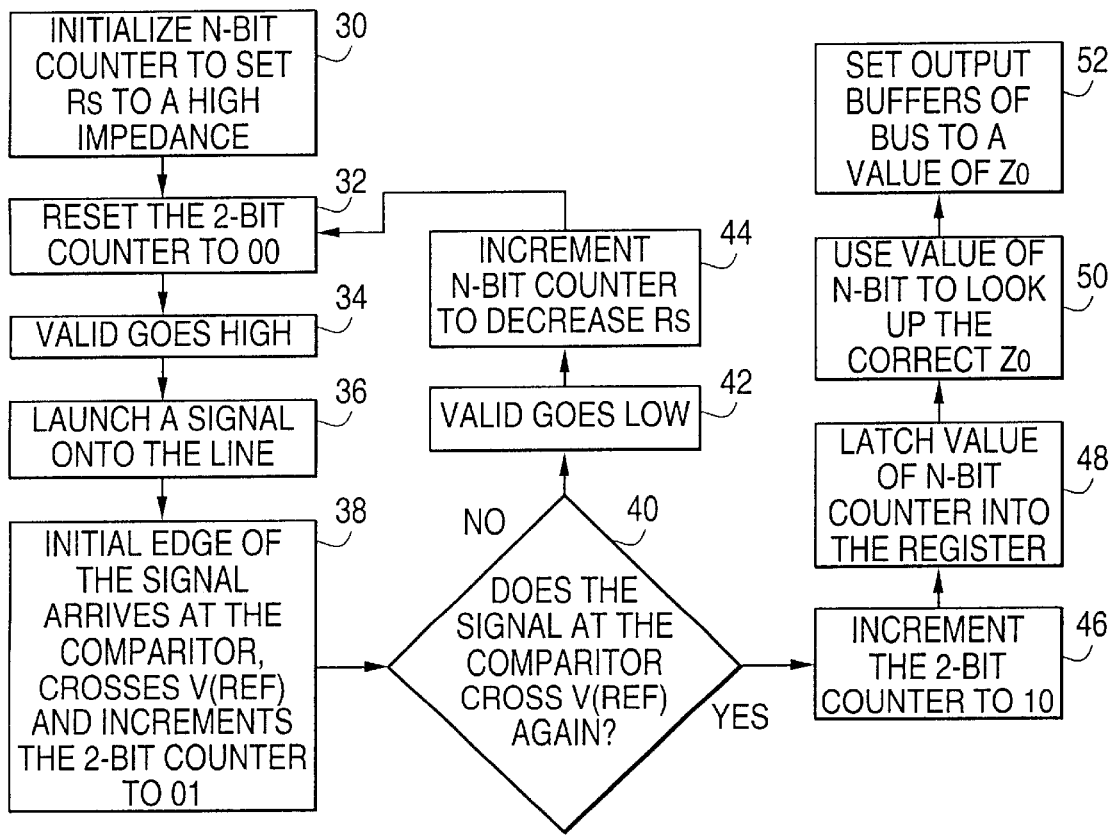
FIG. 3 shows an exemplary flowchart of the operation of FIG. 1.

Returning to FIG. 1, effectively this represents an exemplary circuit which can operate to begin underdriving the transmission line 12 with a waveform such as shown in FIG. 4, then gradually increasing the voltage on the transmission line until an overdrive state similar to FIG. 2 is reached. The circuit of FIG. 1 can then establish Zo by coordinating either with a calculation unit or a lookup table (not shown). FIG. 3 provides an exemplary flowchart of how FIG. 1 can operate to carry out these steps.

Referring both to FIG. 1 and FIG. 3, a first step 30 is to initialize the N-bit counter 18 to set Rs to a high impedance (greater than the estimated maximum Zo) to underdrive the transmission line 12. In conjunction with this, a two-bit counter 20 is reset in step 32 to a value of 00. Next, in step 34, a Valid Signal is set to a high level to one input of the AND gate 22. Effectively, the time that the valid signal is held high is the sample period of the drive pulse applied to the transmission line (step 36), and, as indicated in FIG. 4, is set so as not to catch the fall time of the driving pulse. The other input of the AND gate 22 is coupled to receive the output of the comparator 14 (noting that the output from the comparator will be provided each time $V_B$ at the node B crosses V(ref)). The output of the AND gate 22, in turn, is coupled to the clock input of the two-bit counter 20, such that each output of the AND gate will increment the two-bit counter.

Next, in step 36, a drive pulse from the buffer 10 is launched onto the transmission line 12. As an example, the drive pulse can be a digital pulse preferably having a period greater than five times the estimated delay of the transmission line 12 and a rise time less than the delay of the transmission line. As noted above, initially the drive pulse Vs will be sufficiently low to underdrive the transmission line 12. In step 38, the initial edge of the signal reaches node B and the comparator input. When $V_B$ exceeds V(ref) (e.g., see FIG. 4), the output of the comparator 14 will provide a pulse to the AND gate 22, which, in turn, applies an output to the two-bit counter 20 to increment it to 01.

During the remaining portion of the sample period (before the Valid Signal goes low in step 42), the circuit of FIG. 1 basically is set to recognize if the voltage of $V_B$ crosses the threshold V(ref) again (e.g., see the decision block 40). As long as the transmission line 12 is underdriven, the answer to the decision block 40 will be NO. In this case, after the Valid signal goes low in step 42, the N-bit counter 18 will be incremented to decrease Rs (thereby increasing the drive voltage from the buffer 10) in step 44. Following this, step 32 will be carried out again to reset the two-bit counter 20 to 00 and start the process again with a higher voltage.

Eventually, after several repetitions of the above loop, the point will be reached when the transmission line 12 is sufficiently overdriven that the answer to decision block 40 will be YES. This indicates that a situation similar to that shown in FIG. 2 has been reached wherein a ringback voltage Vb exists which crosses V(ref) for a second time during the sample period. When this occurs, step 46 is carried out to increment the two-bit counter 20 to 10. Next, in step 48, the output of the two-bit counter 20 will latch the value into the register 24 of the N-bit counter 18 at the time the second V(ref) crossing is detected. This value of the N-bit register 18 represents the value that Rs has been incremented down to.

In step 50, the N-bit value representing Rs from the N-bit counter 18 can be used to determine the value of Zo of the transmission line 12. Step 50 can be carried out, for example, by a calculation unit of a processor to calculate Zo from equation 2. Alternatively, a lookup table (not shown) can be accessed to establish Zo. Such a lookup table can be prepared by determining values of Zo of the transmission line which correspond to various values of Rs using equation 2. The lookup table can be provided as part of a processor's basic-input-output-system (BIOS) for example, although this is not intended to be limiting.

Following establishing of Zo, and assuming that the transmission line 12 is actually a dummy bus used, for example, on a PCB, the value Zo determined for this dummy bus can be used to set Rs for buffers coupled to actual operational buses formed on the same PCB. Still further, it is preferable for a dummy trace such as transmission line 12 to be provided on each level of a multiple layer PCB since providing a dummy bus at each level will be a more accurate representation of any buses formed at the same level.

If the present invention is used in conjunction with a processor, the above process described using FIG. 3 can be used, if desired, each time the processor is booted. In addition, or alternatively, the process can be repeated at specified intervals (for example, every N clock cycles) to account for temperature variations of the buffers.

Although the invention has been described referring to details of the exemplary circuit of FIG. 1 and the exemplary process of FIG. 3, it is to be understood, of course, that this is solely for purposes of example, and that the present invention can readily be implemented with other circuitry or processes.

Figure 5:
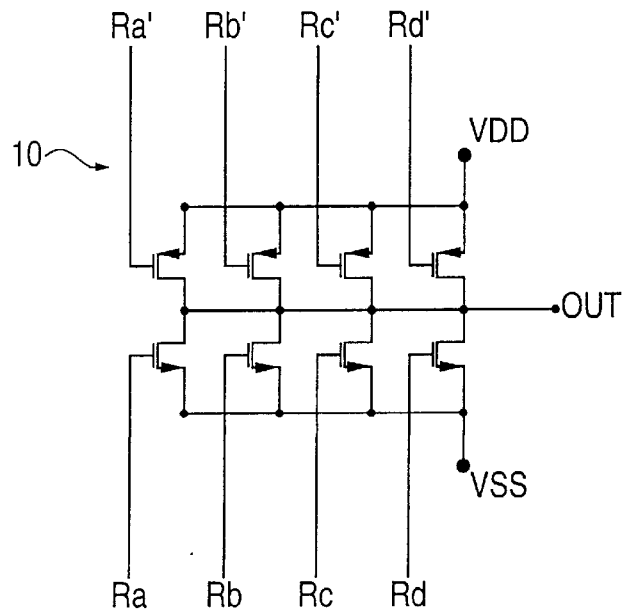
FIG. 5 shows exemplary output stages of a variable impedance buffer which can be used in FIG. 1 to implement the characteristic impedance determination.

FIG. 5 shows an exemplary embodiment of a variable impedance circuit that can be used for the output of the buffer 10 of FIG. 1 so that the impedance can be controlled by the N-bit counter 18. Impedance, in this particular example, is incremented using a four-bit counter 18 to turn on specific transistor legs and give 16 possible impedance values, assuming that the gates on the FETs are appropriately sized. As new legs are added, the equivalent impedance of the buffer will decrease. Of course, other variable impedance buffer arrangements could readily be utilized.

As described above, the present invention provides a characteristic impedance self-matching output buffer which is useful in a wide variety of applications including, but not limited to, processors and related equipment. When used with processors and other systems using buses, it permits more robust bus designs because the designer knows that he or she can count on better impedance matching between buffers and buses. The present invention also eliminates the need for high cost PCBs when tight impedance tolerances are required. In addition, by improving signal integration on the buses, the present invention increases product reliability and decreases system failures.

Although the above description pertains to setting the output resistance Rs of an output buffer to equal the characteristic impedance Zo of a transmission line that it is coupled to, it is to be understood that, if desired, Rs could be deliberately mismatched. For example, in some instances, it is desirable to set Rs equal ½ Zo. This could be useful, for example, in the situation where a common buffer is coupled to two buses on a PCB.

The invention may be embodied in other specific forms without departing from the spirit or essential characteristic thereof. The present embodiments are therefore to be considered in all respects as illustrative and not restrictive.

I claim:

1. A process for determining the characteristic impedance of a transmission line coupled to an output of a buffer, comprising:

setting an output resistance of the buffer to a value at which the buffer will underdrive the transmission line;

decreasing the output resistance of the buffer until the buffer overdrives the transmission line; and determining the characteristic impedance of the transmission line from a ringback voltage at an end of the transmission line opposite the buffer which occurs due to overdriving the transmission line.

2. A process according to claim 1, further comprising reducing the output resistance of the buffer incrementally.

3. A process according to claim 1, further comprising using the value determined for the characteristic impedance of the transmission line to set the output resistance for the buffer to equal the characteristic impedance of the transmission line.

4. A process of determining the characteristic impedance of a transmission line driven by an output buffer, comprising:

applying a voltage pulse from the output buffer to a first end of the transmission line, wherein an output resistance of the output buffer is initially set so that said applied voltage will underdrive the transmission line;

comparing a voltage at a second end of the transmission line, opposite the first end, with a reference voltage, said reference voltage being less than the voltage applied to the transmission line by the output buffer, wherein the voltage at the second end of the transmission line will only cross the reference voltage one time during the rise time of the voltage on the transmission line in response to the applied voltage from the output buffer when the transmission line is underdriven, and wherein the voltage at the second end of the transmission line will cross the reference voltage two times during the rise time of voltage applied from the output buffer if the voltage from the output buffer sufficiently overdrives the transmission line, said second crossing being a ringback voltage caused by overdriving the transmission line;

decreasing the output resistance of the output buffer to increase voltage applied to the transmission line until voltage at the second end of the transmission line crosses the reference voltage two times during the rise time of an applied voltage pulse, to thereby determine when the ringback voltage substantially equals the reference voltage; and determining the characteristic impedance of the transmission line from the ringback voltage when the ringback voltage substantially equals the reference voltage.

5. A process according to claim 4, wherein the output buffer resistance is decreased incrementally.

6. A process according to claim 4, further comprising using the value determined for the characteristic impedance of the transmission line to set the output resistance for the buffer to equal the characteristic impedance of the transmission line.

7. A process according to claim 4, wherein the characteristic impedance is determined from a lookup table.

8. A process according to claim 4, wherein the characteristic impedance of the transmission line is determined in accordance with the equation:

$$Vb = Vs\frac{2Zo}{Rs+Zo}\left(1 + \frac{Rs-Zo}{Rs+Zo}\right) \quad (2)$$

wherein Vb is the ringback voltage, Vs is the applied voltage from the output buffer to the transmission line, Zo is the characteristic impedance of the transmission line and Rs is the output resistance of the output buffer.

9. A process of equalizing the output resistance of a first output buffer with the characteristic impedance of an operational bus which the output buffer is coupled to, wherein the bus is formed on a substrate, said process comprising:

coupling a test buffer to a dummy trace formed on the same substrate as the operational bus;

setting an output impedance of said test buffer to a value which will underdrive the dummy trace;

decreasing the output impedance of the test buffer until the test buffer overdrives the dummy trace;

determining the characteristic impedance of the dummy trace from a ringback voltage at an end of the dummy trace opposite the test buffer which occurs from overdriving the dummy trace; and setting an output resistance of the buffers in accordance with the determined characteristic impedance of the dummy trace to substantially equalize the output resistance of the buffers with the characteristic impedance of the operational bus.

10. A process according to claim 9, further comprising decreasing the output resistance of the test buffer incrementally.

11. A process according to claim 10, wherein the process further comprises determining that the dummy bus is overdriven by comparing a voltage at an end node of the dummy bus, opposite to an end of the bus coupled to the test buffer, with a reference voltage set below a driving voltage provided to the dummy trace by the test buffer, wherein the overdriving of the dummy bus is detected when the voltage at the end node of the dummy bus crosses a reference voltage twice within a predetermined sample time, thereby indicating the occurrence of the ringback voltage.

12. A process according to claim 9, wherein the first output buffer, the test buffer, the operational bus and the dummy bus are provided in a processor, and wherein the process of equalizing the output resistance of the first output buffer with the characteristic impedance of the operational bus is carried out during a boot up operation of the processor.

13. An apparatus for determining the characteristic impedance of a transmission line coupled to an output of a buffer, comprising:

means for setting an output resistance of the buffer to a value at which the buffer will underdrive the transmission line;

means for decreasing the output resistance of the buffer until the buffer overdrives the transmission line; and means for determining the characteristic impedance of the transmission line from a ringback voltage at an end of the transmission line opposite the buffer which occurs due to overdriving the transmission line.

14. An apparatus according to claim 13, wherein the output resistance of the buffer is reduced incrementally.

15. An apparatus according to claim 13, further comprising means for using the determined value of the characteristic impedance of the transmission line to set the output resistance of the buffer to equal the characteristic impedance of the transmission line.

16. An apparatus for determining the characteristic impedance of a transmission line coupled to an output of a buffer comprising:

a controller which sets an output resistance of the buffer to a value at which the buffer will underdrive the transmission line, and which subsequently decreases the output resistance of the buffer until the buffer overdrives the transmission line; and a circuit which determines the characteristic impedance of the transmission line from a ringback voltage at an end of the transmission line opposite the buffer which occurs due to overdriving the transmission line.

17. An apparatus according to claim 16, wherein the controller decreases the output resistance of the buffer incrementally.

18. An apparatus according to claim 16, further comprising a circuit using the determined value of the characteristic impedance of the transmission line to set the output resistance for the buffer to equal the characteristic impedance of the transmission line.

19. A characteristic impedance self-matching output buffer circuit for equalizing the output resistance of an output buffer with the characteristic impedance of a bus driven by the output buffer and formed on a printed circuit board of a processor, comprising:

a circuit which sets an output resistance of the output buffer to a value which will provide driving voltage to a first end of the transmission line which will underdrive the transmission line;

a comparator coupled to a second end of the transmission line which compares a voltage received at the second end of the transmission line with a reference voltage, said reference voltage being less than the driving voltage provided to the first end of the transmission line by the output buffer;

a circuit which decreases the output resistance of the output buffer to increase the driving voltage applied to the first end of the transmission line until the voltage at the second end of the transmission line crosses the reference voltage twice during the rise time of the applied voltage from the output occurs due to a ringback voltage caused by overdriving the transmission line; and a circuit to determine the characteristic impedance of the transmission line from the ringback voltage.

20. An output buffer circuit coupled to a transmission line, comprising:

an output driver, including a variable impedance circuit, which provides a driving pulse voltage to a first end of the transmission line;

a controller which initially sets the variable impedance circuit to underdrive the transmission line, and which subsequently decreases the impedance to increase the driving voltage from the output driver to the transmission line;

a comparator coupled to a second end of the transmission line, opposite the first end, which compares the voltage at the second end of the transmission line with a reference voltage, wherein the reference voltage is lower than the driving voltage from the output driver;

a detector which indicates when the transmission line becomes overdriven by detecting when the drive voltage from the output driver increases to a point that a ringback voltage occurs at the second end of the transmission line; and a determination circuit which determines a characteristic impedance of the transmission line based on the detection of the ringback voltage, wherein the detector detects that the transmission line is overdriven by detecting when the reference voltage is crossed twice during the rise time of a driving pulse voltage from the output driver.

21. An output buffer circuit according to claim 20, wherein the determination circuit determines the characteristic impedance of the transmission line from a lookup table based upon the detected value of the ringback voltage.

22. An output buffer circuit according to claim 20, wherein the determination circuit determines the characteristic impedance of the transmission line from the equation:

$$Vb = Vs \frac{2Zo}{Rs+Zo}\left(1 + \frac{Rs-Zo}{Rs+Zo}\right) \qquad (2)$$

wherein Vb is the ringback voltage, Vs is the applied voltage from the output buffer to the transmission line, Zo is the characteristic impedance of the transmission line and Rs is the output resistance of the output buffer.

23. An output buffer circuit according to claim 20, wherein the controller includes a counter coupled to the output of the comparator, wherein the counter initializes the variable impedance circuit to set an output impedance for the output driver which will underdrive the transmission line, and which subsequently incrementally decreases the output impedance in response to outputs of the comparator indicating that the transmission line is underdriven.

* * * * *